United States Patent
Kanki et al.

(10) Patent No.: US 8,101,513 B2
(45) Date of Patent: Jan. 24, 2012

(54) MANUFACTURE METHOD FOR SEMICONDUCTOR DEVICE USING DAMASCENE METHOD

(75) Inventors: Tsuyoshi Kanki, Kawasaki (JP); Nobuyuki Ohtsuka, Kawasaki (JP); Hisaya Sakai, Kawasaki (JP); Noriyoshi Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 484 days.

(21) Appl. No.: 11/366,511

(22) Filed: Mar. 3, 2006

(65) Prior Publication Data

US 2007/0134899 A1 Jun. 14, 2007

(30) Foreign Application Priority Data

Dec. 12, 2005 (JP) ................................. 2005-357198

(51) Int. Cl.
*H01L 21/44* (2006.01)

(52) U.S. Cl. ... 438/597; 438/622; 438/637; 257/E21.26; 257/E21.253; 257/E21.528; 257/E21.576; 257/E21.579

(58) Field of Classification Search .................. 438/597, 438/622, 637; 257/E21.26, 253, 528, 576, 257/579

See application file for complete search history.

(56) References Cited

U.S. PATENT DOCUMENTS

| | | | | |
|---|---|---|---|---|
| 5,413,940 A * | 5/1995 | Lin et al. | ........................ | 438/14 |
| 6,033,584 A * | 3/2000 | Ngo et al. | ........................ | 216/67 |
| 6,319,809 B1 * | 11/2001 | Chang et al. | ................... | 438/597 |
| 6,465,369 B1 * | 10/2002 | Teng et al. | ..................... | 438/781 |
| 6,528,884 B1 * | 3/2003 | Lopatin et al. | ................. | 257/758 |
| 6,531,389 B1 * | 3/2003 | Shue et al. | ..................... | 438/637 |
| 6,930,045 B2 | 8/2005 | Ikeda | | |
| 2004/0029386 A1 | 2/2004 | Lee et al. | | |
| 2004/0256351 A1 * | 12/2004 | Chung et al. | .................... | 216/13 |
| 2006/0063373 A1 * | 3/2006 | Gambino et al. | ............ | 438/622 |
| 2006/0225651 A1 * | 10/2006 | Ueno et al. | ..................... | 118/719 |
| 2006/0281308 A1 * | 12/2006 | Aggarwal et al. | ............. | 438/675 |
| 2007/0001303 A1 * | 1/2007 | Lim et al. | ....................... | 257/751 |
| 2007/0134899 A1 * | 6/2007 | Kanki et al. | .................. | 438/597 |

FOREIGN PATENT DOCUMENTS

| | | |
|---|---|---|
| JP | 10-242274 A | 9/1998 |
| JP | 2000-040700 A | 2/2000 |
| JP | 2000-164712 A | 6/2000 |
| JP | 2004-095728 A | 3/2004 |
| JP | 2004-096080 A | 3/2004 |
| JP | 2004-356500 | 12/2004 |

OTHER PUBLICATIONS

Japanese Office Action dated Dec. 22, 2009 issued in corresponding Japanese Patent Application No. 2005-357198 (w/Partial Translation).

* cited by examiner

*Primary Examiner* — Thao Le
*Assistant Examiner* — Eric Jones
(74) *Attorney, Agent, or Firm* — Westerman, Hattori, Daniels & Adrian, LLP

(57) ABSTRACT

(a) A recess is formed through an insulating film formed over a semiconductor substrate. (b) After the recess is formed, a temperature of the substrate is raised to 300° C. or higher at a temperature rising rate of 10° C./s or slower and a first degassing process is executed. (c) After the first degassing process, a conductive film is deposited on the insulating film, the conductive film being embedded in the recess. (d) The deposited conductive film is polished until the insulating film is exposed. It is possible to suppress occurrence of defects during CMP to be performed after a conductive member is deposited on the surface of the insulating film having a recess formed therethrough.

9 Claims, 11 Drawing Sheets

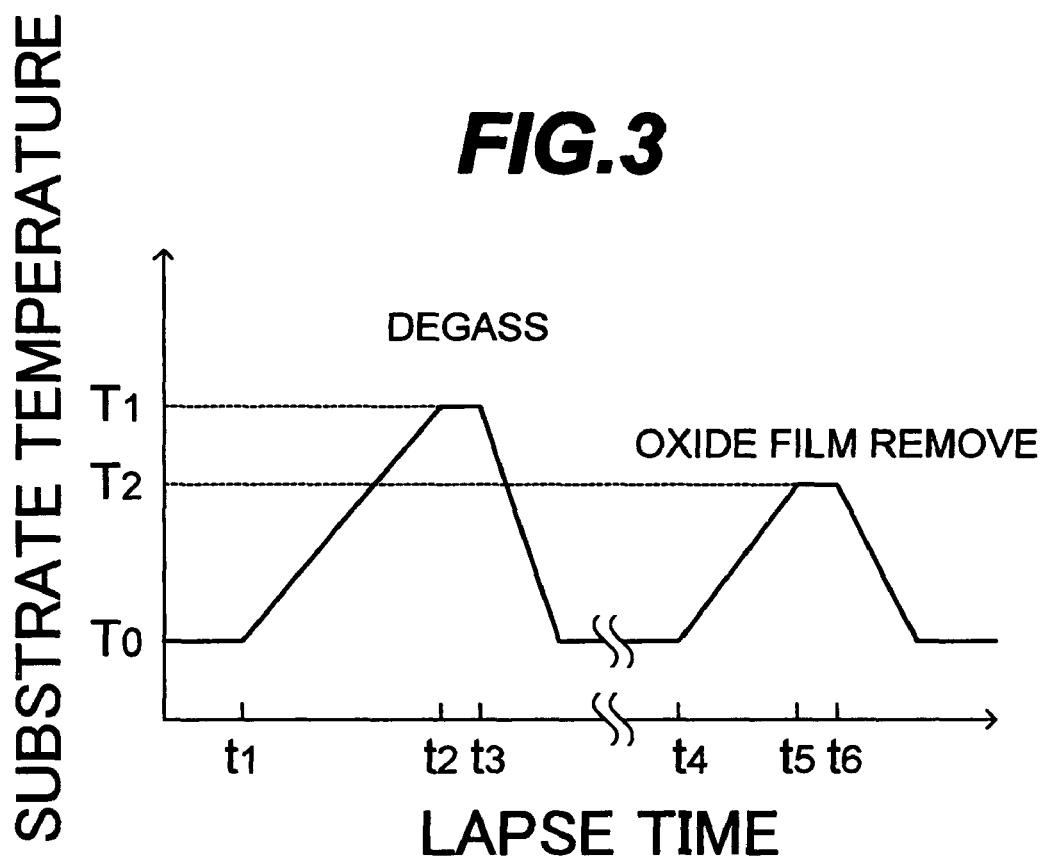

FIG.4A

HIGH-DENSITY WIRING

|  | DEGAS TEMPERATURE | |
| --- | --- | --- |
|  | 200°C | 350°C |
| EMBOSS DEFECT | 1343 | 283 |
| HOLLOW DEFECT | 77 | 69 |
| BOUNDARY CORROSION | 77 | 29 |
| TOTAL | 1535 | 381 |

FIG.4B

LOW-DENSITY WIRING

|  | DEGAS TEMPERATURE | |
| --- | --- | --- |
|  | 200°C | 350°C |
| EMBOSS DEFECT | 22 | 18 |
| HOLLOW DEFECT | 44 | 7 |
| BOUNDARY CORROSION | 123 | 14 |
| TOTAL | 225 | 55 |

MANUFACTURE METHOD FOR SEMICONDUCTOR DEVICE USING DAMASCENE METHOD

CROSS REFERENCE TO RELATED APPLICATION

This application is based on and claims priority of Japanese Patent Application No. 2005-357198 filed on Dec. 12, 2005, the entire contents of which are incorporated herein by reference.

BACKGROUND OF THE INVENTION

A) Field of the Invention

The present invention relates to a semiconductor device manufacture method, and more particularly to a semiconductor device manufacture method including a process of filling a recess such as a wiring trench with a conductive member by using a damascene method.

B) Description of the Related Art

Brief description will be made on a conventional wiring forming method using a damascene method. After a recess such as a wiring trench is formed through an interlayer insulating film, a degassing process is executed at a substrate temperature of about 350 to 400° C. Thereafter, the surface of an underlying conductive member exposed on the bottom of the recess is etched by argon plasma or the like to remove a surface decomposed layer. The inner surface of the recess and the upper surface of the interlayer insulating film are covered with a barrier metal film, and a Cu seed layer is formed on the surface of the barrier metal film. Cu is electroplated to fill the inside of the recess with Cu. Unnecessary Cu is removed by chemical mechanical polishing (CMP) to leave a wiring made of Cu only in the recess.

JP-A-2004-356500 indicates that contact failure between upper and lower wirings are likely to be generated if a degassing process is executed at 350 to 400° C. According to the method disclosed in JP-A-2004-356500, occurrence of contact failure is suppressed by lowering a temperature of a degassing process to a range of 150 to 300° C.

The present inventors have found that various defects are generated during CMP if the degassing process temperature is lowered, as indicated in JP-A-2004-356500.

FIGS. 10A to 10C are sketches of electron microscopic photographs showing surfaces of Cu wirings formed by executing a degassing process at 200° C. and a damascene method. In FIG. 10A, a number of embossed defects are generated on the surfaces of Cu wirings. In FIG. 10B, hollow defects are generated in Cu wirings. In FIG. 10C, an interface between a Cu wiring and a barrier metal film is corroded and boundary corrosion defects are generated along the interface.

SUMMARY OF THE INVENTION

An object of the present invention is to provide a semiconductor device manufacture method capable of suppressing generation of defects during CMP after a conductive member is deposited on the surface of an insulating film having a recess formed therethrough.

According to one aspect of the present invention there is provided a semiconductor device manufacture method comprising steps of: (a) forming a recess through an insulating film formed over a semiconductor substrate; (b) after the recess is formed, raising a temperature of the substrate to 300° C. or higher at a temperature rising rate of 10° C./s or slower to execute a first degassing process; (c) after the first degassing process, depositing a conductive film on the insulating film, the conductive film being embedded in the recess; and (d) polishing the deposited conductive film until the insulating film is exposed.

By setting a temperature rising rate at the step (b) to 10° C./s or lower, it is possible to suppress generation of contact failure between upper and lower wirings. By setting the first degassing process temperature to 300° C. or higher, it is possible to suppress generation of defects during polishing.

BRIEF DESCRIPTION OF THE DRAWINGS

FIG. 3 is a graph showing a change in a substrate temperature during a degassing process and an oxide film removing process of the manufacture method of the first embodiment.

FIGS. 4A and 4B are tables showing the number of wiring defects after CMP of samples manufactured by the manufacture method of the first embodiment and samples manufactured by a comparative manufacture method.

DESCRIPTION OF THE PREFERRED EMBODIMENTS

Figure 1:
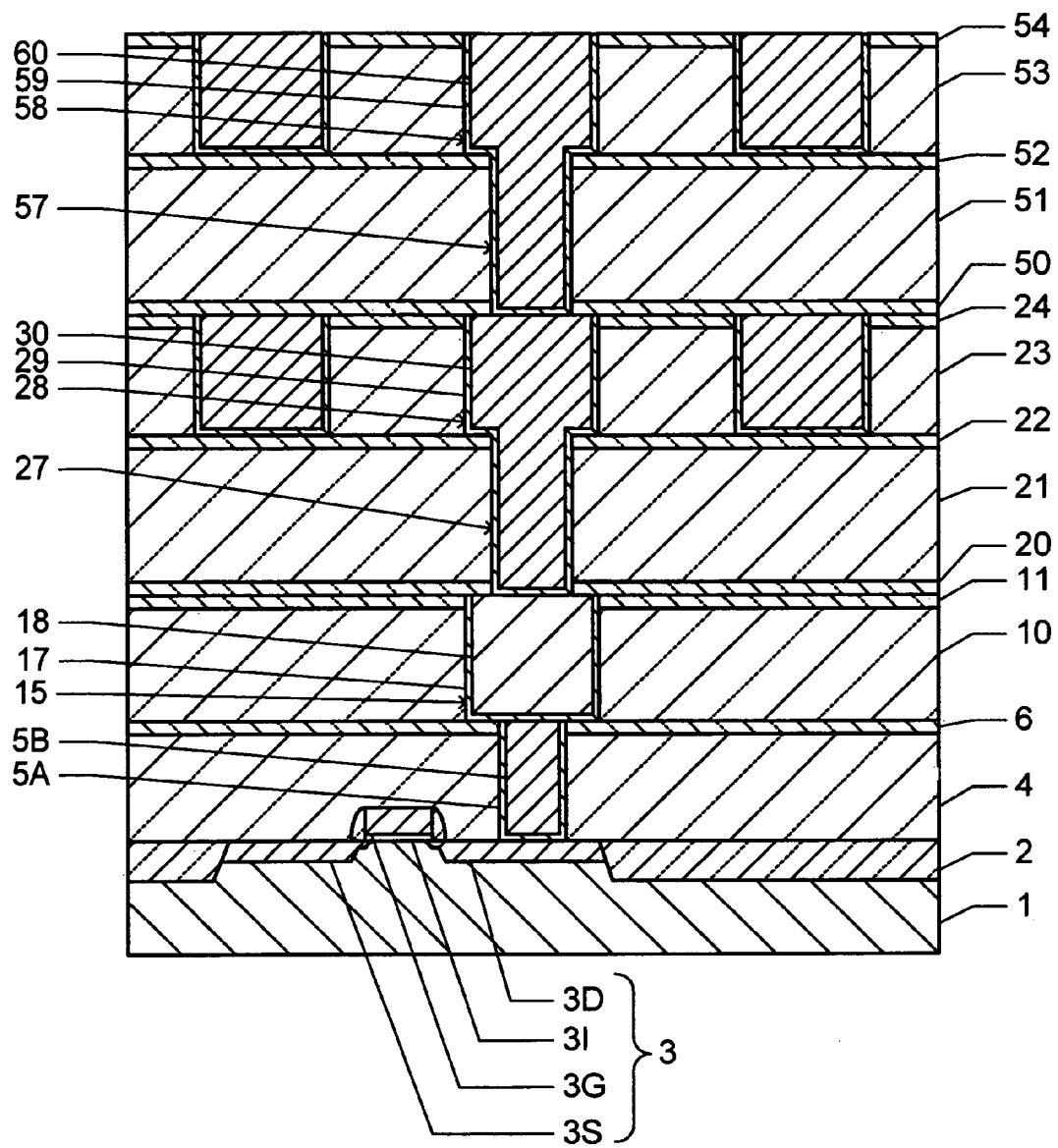
FIG. 1 is a cross sectional view of a semiconductor device manufactured by a semiconductor device manufacture method according to a first embodiment.

FIG. 1 is a cross sectional view of a semiconductor device manufactured by a manufacture method according to an embodiment. An isolation insulating film 2 of a shallow trench isolation (STI) structure is formed in a surface layer of a semiconductor substrate 1 made of silicon to define active regions. A MOS transistor 3 is formed in this active region. The MOS transistor 3 comprises a source region 3S, a drain region 3D, a gate insulating film 3I and a gate electrode 3G.

An interlayer insulating film 4 of silicon oxide having a thickness of 300 nm and a protective film 6 of SiOC having a thickness of 50 nm are stacked on the semiconductor substrate 1 to cover the MOS transistor 3. A via hole is formed through the protective film 6 and interlayer insulating film 4, and a partial surface of the drain region 3D is exposed on the bottom of the via hole. A conductive plug 5B made of tungsten (W) fills the via hole. A barrier metal film 5A of TiN having a thickness of 25 nm is disposed between the conductive plug 5B and the via hole inner surface.

This structure can be formed by well-known photolithography, etching, chemical vapor deposition (CVD), chemical mechanical polishing (CMP) and the like.

An interlayer insulating film 10 is formed on the protective film 6, the interlayer insulating film being made of low dielectric constant material such as SiOC-containing material and porous silica. The upper surface of the interlayer insulating film 10 is covered with a protective film 11 made of SiC- or SiN-containing material. A wiring trench 15 is formed through the protective film 11 and interlayer insulating film 10, reaching the bottom of the interlayer insulating film 10 and passing over the conductive plug 5B. A barrier metal film 17 covers the inner surface of the wiring trench 15 and the inside of the wiring trench 15 is filled with a first-layer copper wiring 18. The copper wiring 18 is electrically connected to the conductive plug 5B. The barrier metal film 17 is made of, for example, Ta, TaN, TiN, WN or the like. The barrier metal film 17 may have a two-layer structure of a Ta film and a TaN film or a two-layer structure of a Ti film and a TiN film.

A cap film 20, a via layer interlayer insulating film 21, an etching stopper film 22, a wiring layer interlayer insulating film 23 and a protective film 24 are stacked on the protective film 11 in this order recited.

A wiring trench 28 is formed through the wiring layer interlayer insulating film 23, and a via hole 27 is formed through the via layer interlayer insulating film 21. The wiring trench 28 reaches the upper surface of the etching stopper film 22. The via hole 27 opens on the bottom of the wiring trench 28, passes through the cap film 20 and reaches the upper surface of the lower layer wiring 18. A plurality of other wiring trenches are formed through the wiring layer interlayer insulating film 23.

A barrier metal film 29 covers the inner surfaces of the wiring trench 28 and via hole 27, and the insides of the wiring trench 28 and via hole 27 are filled with conductive members 30 of copper or copper alloy. The conductive member 30 is connected to the first-layer wiring 18 to constitute a second-layer wiring. The barrier metal film is also formed on the inner surfaces of other wiring trenches and copper wirings are contained in these wiring grooves.

A cap film 50, a via layer interlayer insulating film 51, an etching stopper film 52, a wiring interlayer insulating film 53 and a protective film 54 are stacked on the second-layer wiring layer. Similar to the second-layer wiring structure, a wiring trench 58 and a via hole 57 are formed, and a barrier metal film 59 and a conductive member 60 fills the wiring trench 58 and via hole 57. The conductive member 60 constitutes a third-layer wiring.

With reference to FIGS. 2A to 2D, description will be made on a method of forming the second-layer wiring layer. The second-layer wiring layer is formed by a dual damascene method. The third-layer wiring layer and upper wiring layers are formed by a method similar to the method of forming the second-layer wiring layer. The first-layer wiring layer 18 is formed by a single damascene method. The method of forming the first-layer wiring 18 is similar to the second-layer wiring forming method excluding the process regarding the via layer of the second wiring layer.

Figure 2A:
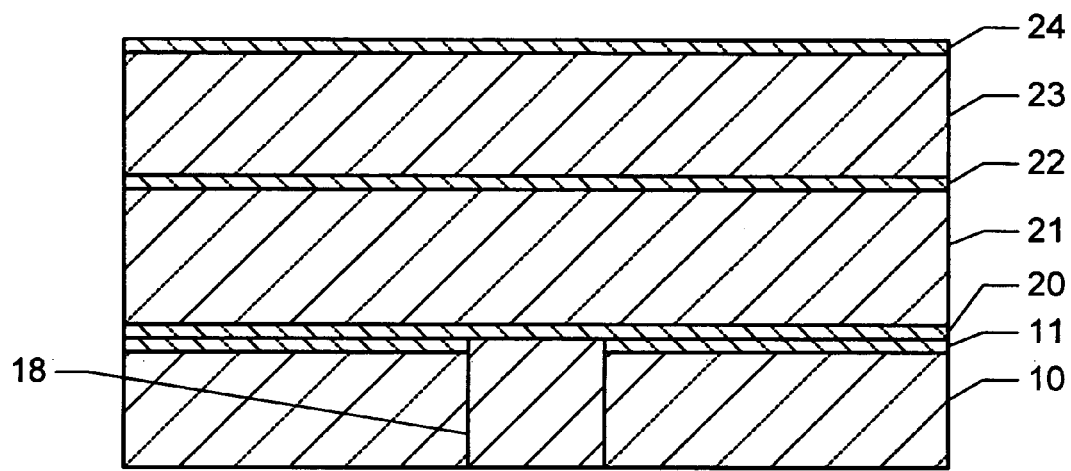
FIGS. 2A to 2D are cross sectional views of a device at intermediate stages of the manufacture method of the first embodiment.

As shown in FIG. 2A, a cap film 20 is formed on a protective film 11 of a first-layer wiring layer by chemical vapor deposition (CVD), the cap film 20 being made of SiC- or SiN-containing material and having a thickness of 20 to 60 nm. A via layer interlayer insulting film 21 is formed on the cap film 20 by CVD, the via layer interlayer insulating film 21 being made of SiOC-containing material and having a thickness of 220 to 250 nm. An etching stopper film 22 is formed on the via layer interlayer insulating film 21 by CVD, the etching stopper film 22 being made of SiC- or SiN-containing material and having a thickness of 20 to 60 nm. A wiring layer interlayer insulating film 23 is formed on the etching stopper film 22 by CVD, the wiring layer interlayer insulating film 23 being made of SiOC- or SiO-containing material and having a thickness of 220 to 250 nm. A protective film 24 is formed on the wiring layer interlayer insulating film 23 by CVD, the protective film 24 being made of SiC- or SiN-containing material and having a thickness of 20 to 60 nm. The interlayer insulating films 21 and 23 may be made of organic low dielectric constant insulting material, porous silica or the like.

Figure 2B:
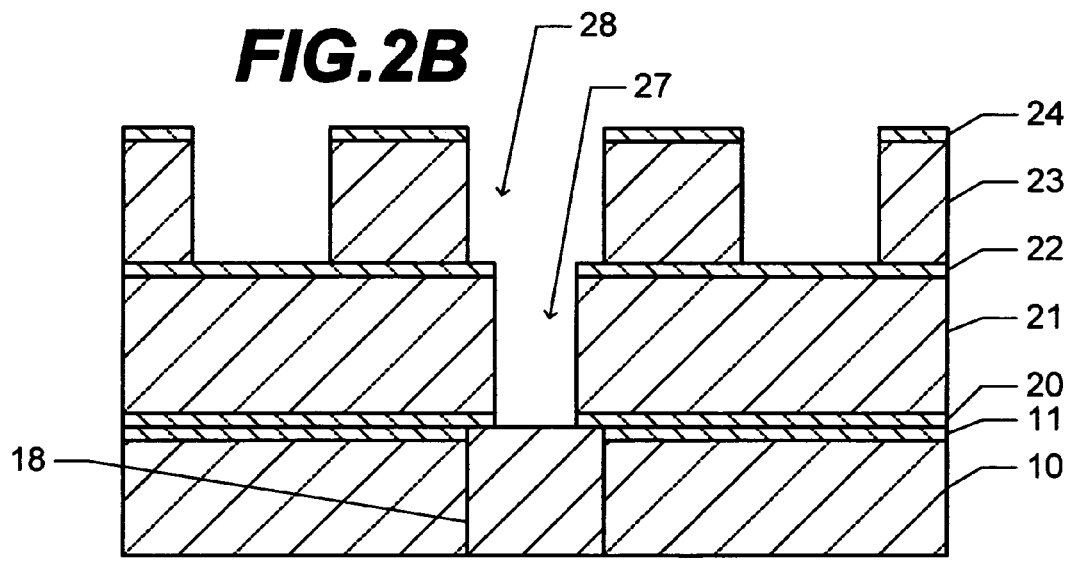

As shown in FIG. 2B, a wiring trench 28 and a via hole 27 are formed, the wiring trench 28 reaching the bottom of the wiring layer interlayer insulating film 23 and the via hole 27 extending from the bottom of the wiring trench 28 to the upper surface of the lower layer wiring 18. A plurality of other wiring trenches are formed at the same time when the wiring trench 28 is formed. In the following, description will be made on an example of a method of forming the wiring trench 28 and via hole 27.

First, a resist pattern is formed on the protective film 24, having an opening of the same plan shape as that of the via hole 27. By using this resist pattern as a mask, the via hole 27 is formed by etching down to the bottom of the cap film 20. After the resist pattern used as the etching mask is removed, resist is newly coated and etched back to leave resist in a partial lower region of the inside of the via hole 27.

Next, a resist pattern is formed having openings of the same plan shape as that of the wiring trench 28 and other wiring trenches. By using this resist pattern as a mask, the wiring trench 28 and other wiring trenches are formed by etching down to the bottom of the wiring layer interlayer insulating film 23. In this case, the resist deposited on the bottom of the via hole 27 protects the lower layer wiring 18 exposed on the bottom.

After the wiring trench 28 and other trenches are formed, the resist pattern used as the etching mask and the resist remaining in the via hole 27 are removed. In this manner, the wiring trench 28 and other wiring trenches and via hole 27 are formed. The diameter of the via hole 27 is, for example, 90 nm, and the width of the wiring trench 28 and other trenches is, for example, 100 nm. Another method may be used that trenches is formed first, and then the via hole is formed.

Next, a degassing process and an oxide film removing process are executed. With reference to FIG. 3, description will be made on the degassing process and oxide film removing process.

FIG. 3 shows a time change in a substrate temperature. First, the substrate formed with the wiring trench 28, other trenches and via hole 27 shown in FIG. 2B is loaded in a degassing process chamber and the inside of the chamber is evacuated. Heating the substrate starts at time $t_1$. A substrate temperature at time $t_1$ is represented by $T_0$. The substrate temperature is raised to a process temperature $T_1$ under the condition of a temperature rising rate of 10° C./s or slower. The process temperature $T_1$ is, for example, 350° C. As the substrate temperature reaches the process temperature $T_1$ at time $t_2$, the temperature is kept constant until time $t_3$. A degassing process time from time $t_2$ to time $t_3$ is, for example, one minute. After the degassing process is completed, the substrate temperature is lowered to the room temperature and the substrate is transported into an oxide film removing process chamber. This transportation is performed in the state that a vacuum atmosphere is maintained.

After the substrate is loaded in the oxide film removing process chamber, hydrogen gas is introduced into the chamber and heating the substrate starts at time $t_4$. A flow rate of hydrogen gas is 150 to 300 sccm and a pressure in the chamber is 100 to 300 Pa. The substrate temperature is raised to a process temperature $T_2$ under the condition of a temperature rising rate of 10° C./s. The process temperature $T_2$ is, for example, 150 to 300° C. After the substrate temperature reaches the process temperature $T_2$ at time $t_5$, the temperature is kept constant until time $t_6$. A process time from time $t_5$ to time $t_6$ is 30 seconds or longer. After time $t_6$, the substrate temperature is lowered to the room temperature and the substrate is unloaded from the chamber. Gas to be introduced into the chamber may be other reducing gas in place of hydrogen gas, such as $NH_3$, CO or $CH_4$.

A plasma process may be executed by generating plasma of these reducing gases. If a plasma process is to be executed, the substrate temperature is the room temperature. A pressure in a plasma process chamber is set to 100 Pa or lower, a reducing gas flow rate is set to 300 sccm or smaller, a plasma generation DC power is set to 100 to 500 W, and a plasma process time is set to 30 seconds or longer. An oxide film may be physically removed by using plasma of inert gas such as Ar.

Figure 2C:
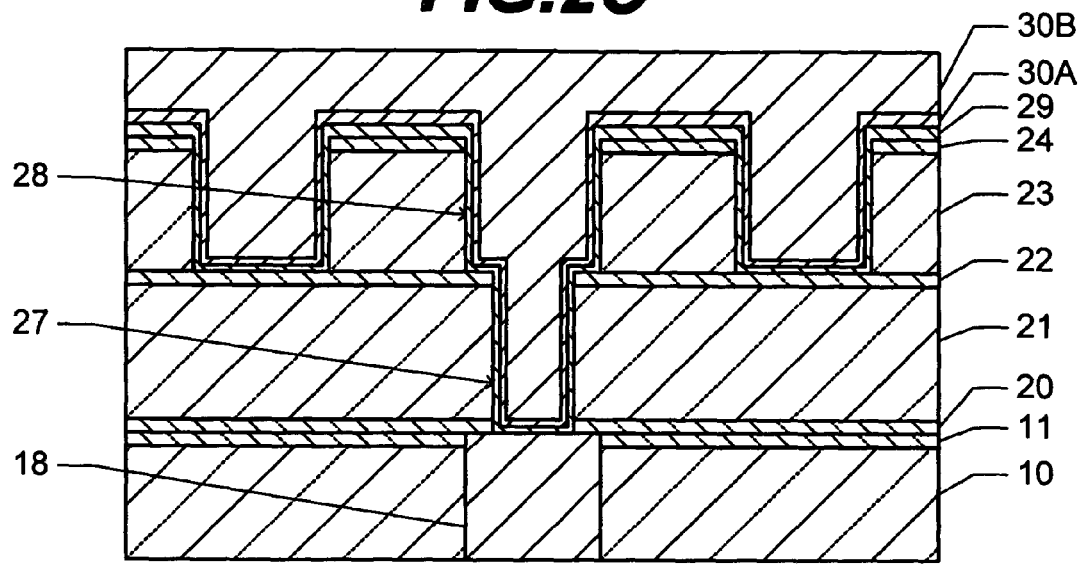

As shown in FIG. 2C, a barrier metal film 29 is formed by sputtering to cover the inner surfaces of the via hole 27 and wiring trench 28 and other wiring trenches and the upper surface of the protective film 24. The barrier metal film 29 is formed in such a manner that a thickness thereof is set to 5 to 20 nm on the flat surface of the protective film 24. The barrier metal film 29 covering the inner surfaces of the via hole 27, wiring trench 28 and other wiring trenches is thinner than that on the flat surface.

A seed layer 30A of Cu is formed by sputtering on the surface of the barrier metal film 29. The seed layer 30A is formed in such a manner that a thickness thereof on the flat surface is set to 40 to 100 nm. The seed layer 30A may be formed by CVD. By using the seed layer 30A as an electrode, Cu or Cu alloy is electroplated on the surface of the seed layer 30A to thereby form a conductive film 30B.

Figure 2D:
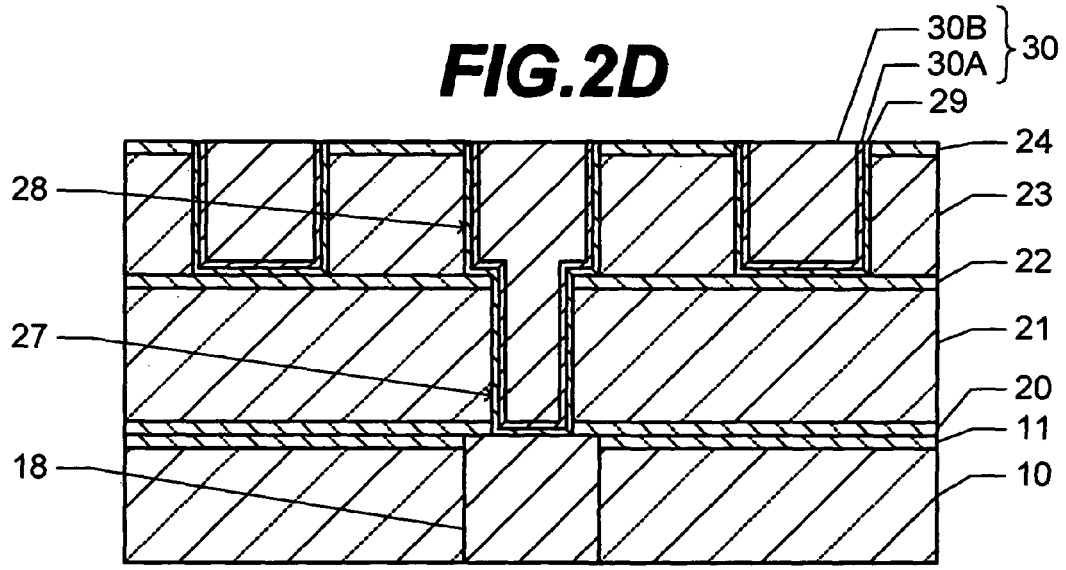

As shown in FIG. 2D, CMP is performed until the surface of the protective film 24 is exposed. The barrier metal film 29 and a conductive member 30 of Cu or Cu alloy remain in the via hole 27, wiring trench 28 and other wiring trenches.

Figure 10A:
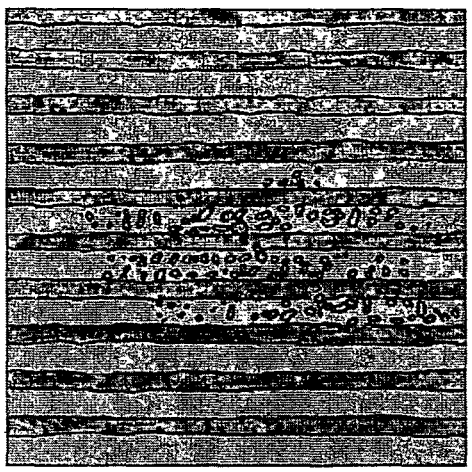
FIGS. 10A to 10C are sketches of electron microscopic photographs showing defects of wirings formed by a conventional method.
Figure 10B:
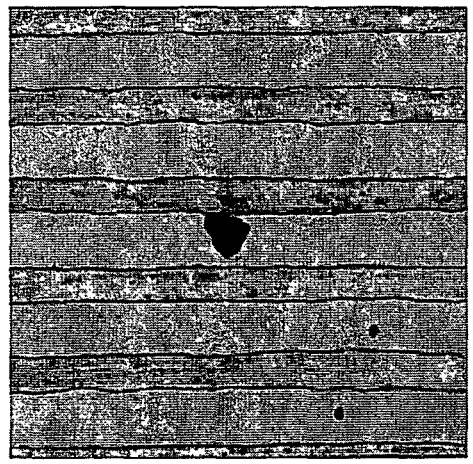
Figure 10C:
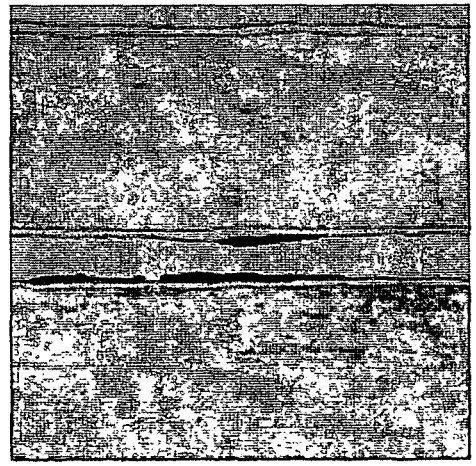

FIGS. 4A and 4B show the number of defect occurrence parts of Cu wirings after CMP. For the purposes of comparison, the number of defect occurrence parts of samples is also shown, the samples being formed at the degassing process temperature $T_1$ of 200° C. shown in FIG. 3. FIG. 4A shows evaluation results of samples of a number of wirings disposed at a high density on a wafer of 8 inches in diameter, with both a width of wirings and an interval between wirings being set to 100 nm. FIG. 4B shows evaluation results of samples of a number of wirings disposed at a low density, with a width of wirings being set to 100 nm and an interval between wirings being set to 500 nm. Emboss defects, hollow defects and boundary corrosion defects shown in FIGS. 4A and 4B correspond to the defects of the type shown in FIGS. 10A, 10B and 10C. A total entry indicates a sum of the number of defects of these three types and the number of defects not classified into these three types.

The sample evaluation results indicate the following points. As the degassing process temperature $T_1$ is raised from 200° C. to 350° C., the numbers of emboss defects and boundary corrosion defects are reduced considerably for the samples having wirings disposed at a high density, whereas the numbers of hollow defects and boundary corrosion defects are reduced considerably for the sample having wirings disposed at a low density. By setting the degassing process temperature $T_1$ to 350° C., the generation of wiring defects can be suppressed more compared to setting the degassing process temperature $T_1$ to 200° C. Next, with reference to FIGS. 5A and 5B, a preferred range of the degassing process temperature will be described.

Figure 5A:
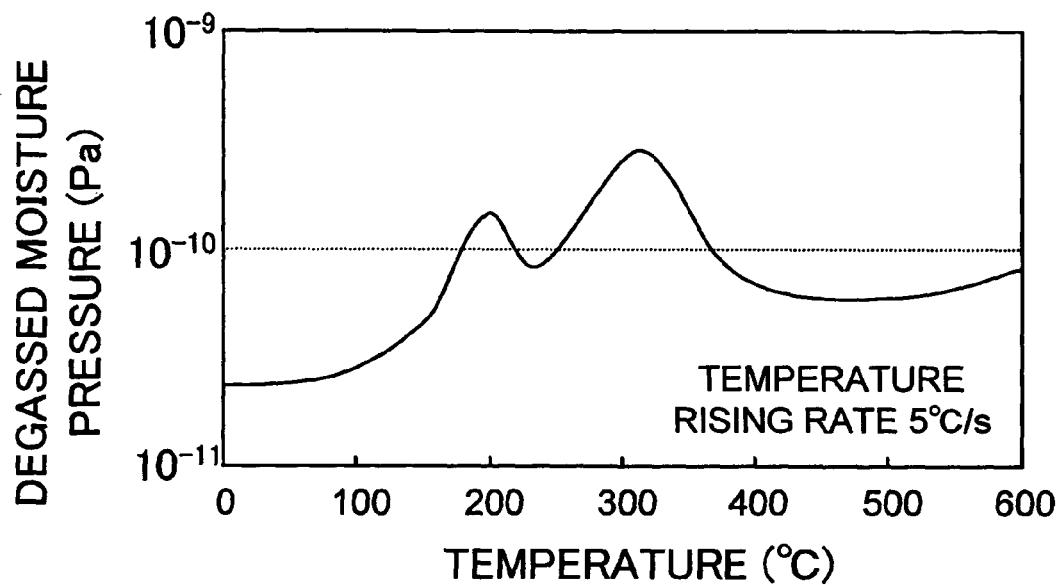
FIG. 5A is a graph showing a relation between a temperature and a quantity of moisture generated when a substrate temperature is raised at 5° C./s.

FIG. 5A shows a time change in a quantity of moisture generated when the substrate temperature is raised at a temperature rising rate of 5° C./s. The abscissa represents a substrate temperature in the unit of "° C." and the ordinate represents a partial pressure of generated moisture in the unit of "Pa". As the substrate temperature is raised from the room temperature, the quantity of generated moisture increases gradually and takes a maximum once near at a substrate temperature of 200° C. As the substrate temperature is raised further, the quantity takes a minimum value and thereafter takes a maximum value again near at a substrate temperature of 300° C.

The maximum value at the substrate temperature of 200° C. may be ascribed to that almost all moisture attached to the substrate surface is desorbed near at 200° C. As the temperature is raised further, moisture contained in the interlayer insulating film starts being desorbed. At the substrate temperature of 300° C., almost all moisture contained in the interlayer insulating film can be desorbed.

Figure 5B:
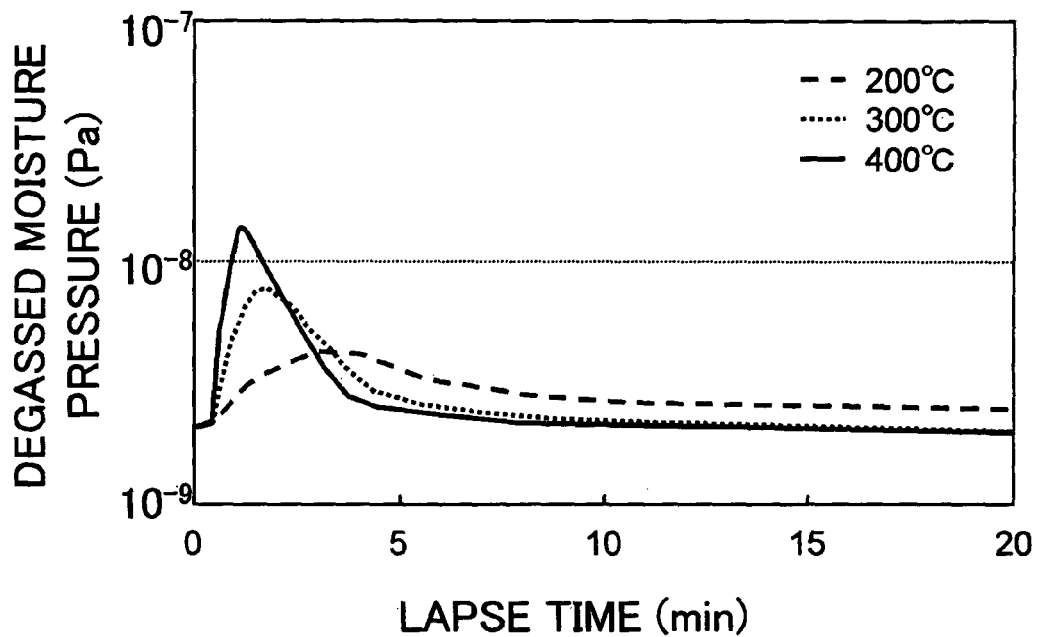
FIG. 5B is a graph showing a relation between a lapse time after the start of heating and a quantity of moisture generated by keeping the temperature constant at 200° C., 300° C. and 400° C.

FIG. 5B shows a time change in the quantities of moisture generated as the substrate temperature was raised to target temperatures 200° C., 300° C. and 400° C. in 30 seconds and the temperatures were kept constant after substrate temperatures reached to the target temperatures. The abscissa of FIG. 5B represents a lapsed time in the unit of "min" and the ordinate represents a partial pressure of generated moisture in the unit of "Pa". A broken line a, a dotted line b and a solid line c indicate the quantities of generated moisture when the substrate temperature is maintained at 200° C., 300° C. and 400° C., respectively. At the substrate temperature of 200° C., moisture is not desorbed completely even at a lapse time of 20 min. after temperature rise.

At both the substrate temperatures kept constant at 300° C. and 400° C., it can be considered that moisture is almost desorbed at the lapse time of about 10 min. after temperature rise. In order to avoid prolongation of a degassing process time, it is preferable to set the degassing process temperature $T_1$ shown in FIG. 3 to 300° C. or higher. It is also preferable to set the degassing process temperature to 400° C. or lower.

Figure 6:
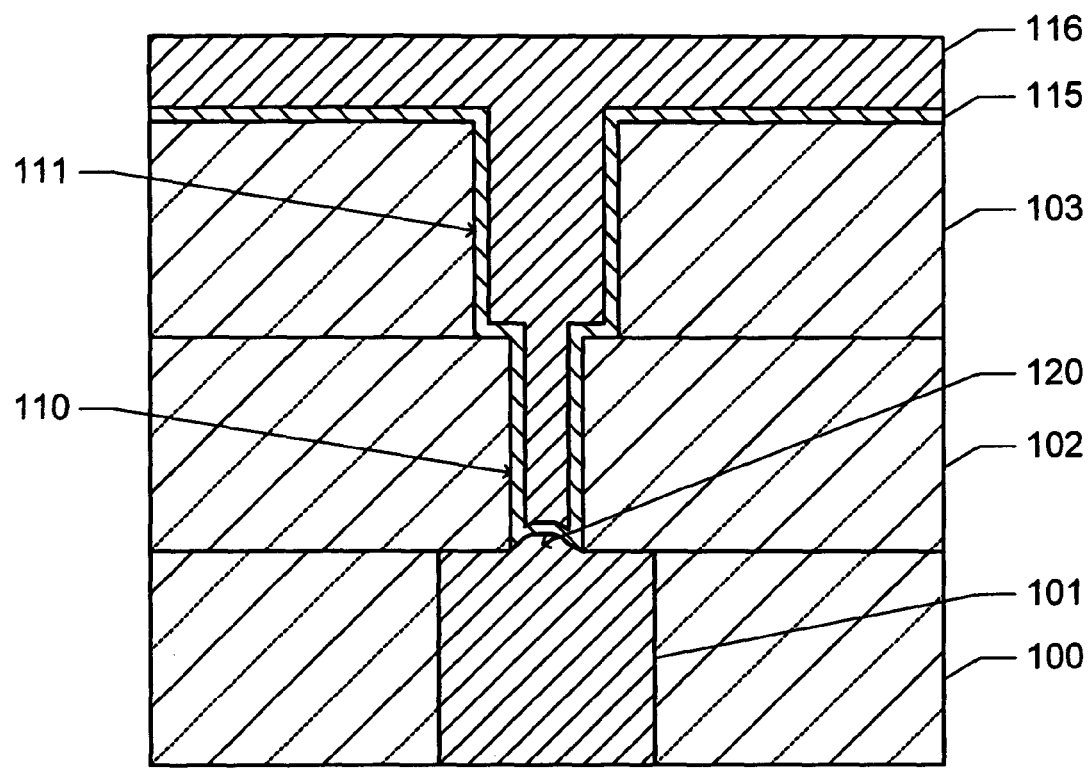
FIG. 6 is a cross sectional view showing a via hole and peripheral regions explaining the cause of contact failure occurred when using a conventional manufacture method.

If the degassing process temperature is raised as high as about 350° C., there is fear that contact failure as described in JP-A-2004-356500 occurs. With reference to FIG. 6, the factors of contact failure occurrence will be described.

FIG. 6 is a cross sectional view of a wiring and its nearby region formed by a conventional method including a degassing process at a temperature of about 350° C. A wiring 101 is embedded in a wiring trench formed through an interlayer insulating film 100. A via layer interlayer insulating film 102 and a wiring layer interlayer insulating film 103 are sequentially stacked on the interlayer insulating film 100. A via hole 110 is formed through the via layer interlayer insulating film 102 and a wiring trench 111 is formed through the wiring layer interlayer insulating film 103. The inner surfaces of the via hole 110 and wiring trench 111 are covered with a barrier metal film 115, and the insides thereof are filled with copper.

As a degassing process is executed at a temperature of 350° C. after the via hole 110 is formed, the surface of the lower wiring 101 exposed on the bottom of the via hole 110 is embossed and a projection 120 is formed in some cases. As the projection 120 is formed, a coverage of the barrier metal film 115 is degraded and a contact failure is likely to occur.

Figure 7:
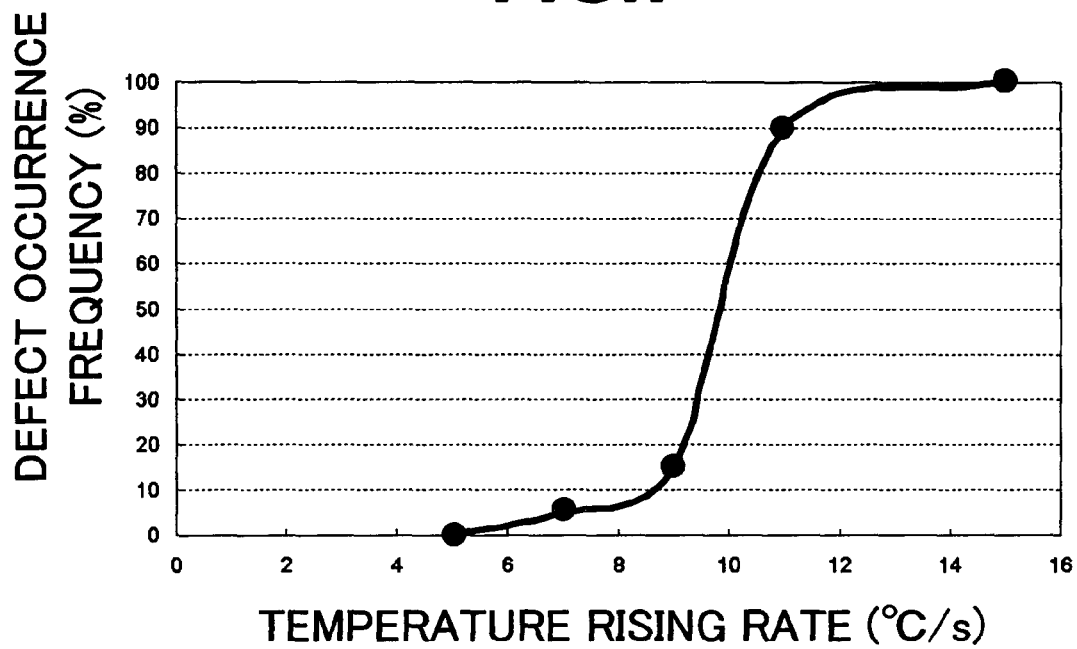
FIG. 7 is a graph showing a relation between a temperature rising rate during a degassing process and a contact failure occurrence frequency.

FIG. 7 shows a relation between a substrate temperature rising rate for a degassing process and a contact failure occurrence frequency. The abscissa represents a temperature rising rate in the unit of "° C./s" and the ordinate represents a contact failure occurrence frequency in the unit of "%". A degassing process temperature was set to 350° C. At the temperature rising rate of 5° C./s, contact failure did not occur even at a degassing process temperature of 350° C. As the temperature rising rate was speeded up from 9° C./s to 11° C./s, a contact failure occurrence frequency increased abruptly. It can be understood from this evaluation result that the temperature rising rate is set preferably to 10° C./s or slower and more preferably to 5° C./s or slower. Similarly, the temperature rising rate for the oxide film removing process shown in FIG. 3 is set preferably to 10° C./s or slower and more preferably to 5° C./s or slower.

As described above, occurrence of contact failure and generation of the wiring defects after CMP can be suppressed by lowering the temperature rising rate and raising the degassing process temperature to 300° C. or higher.

Next, with reference to FIG. 8, description will be made on a semiconductor device manufacture method according to the second embodiment. In the second embodiment, a second degassing process is executed after the oxide film removing process of the first embodiment. Other processes are the same as those of the first embodiment.

Figure 8:
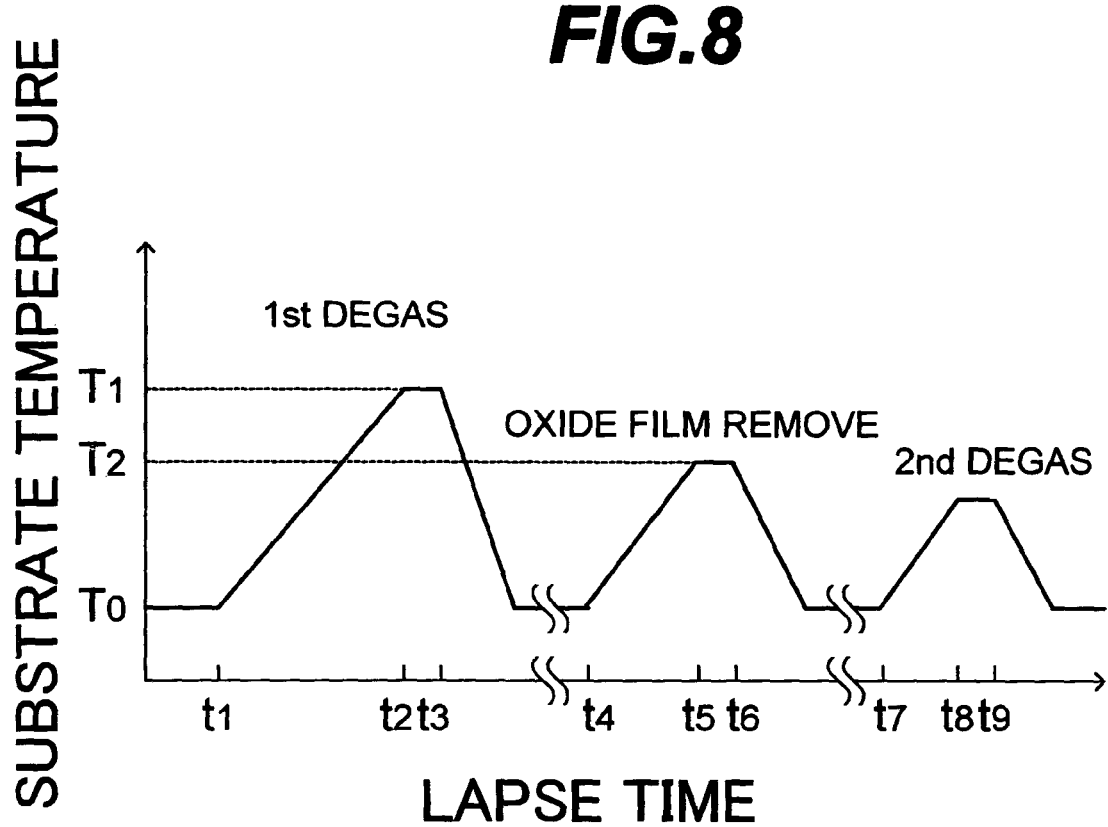
FIG. 8 is a graph showing a change in a substrate temperature during a manufacture method according to a second embodiment.

As shown in FIG. 8, after the oxide film removing process is completed, the substrate is transported into a degassing process chamber. As the substrate is loaded in the chamber, the inside of the chamber is evacuated and heating the substrate starts at time $t_7$. The temperature rising rate of the substrate is set in the suitable range of the temperature rising rate for the first degassing process.

Moisture generated during the oxide film removing process remains on the substrate surface in some cases. The moisture remaining on the surface can be removed by executing the second degassing process. In the second degassing process, it is not necessary to remove moisture contained in the interlayer insulating film, but it is sufficient if only the moisture remaining on the surface is removed. Therefore, the process temperature may be lower than that of the first degassing process. For example, the process temperature may be set to 150 to 250° C. The process time with the temperature being kept constant is preferably set to 30 seconds or longer.

Next, with reference to FIG. 9, description will be made on a semiconductor device manufacture method according to the third embodiment. In the third embodiment, ultraviolet irradiation is performed after the oxide film removing process of the first embodiment. Other processes are the same as those of the first embodiment.

Figure 9:
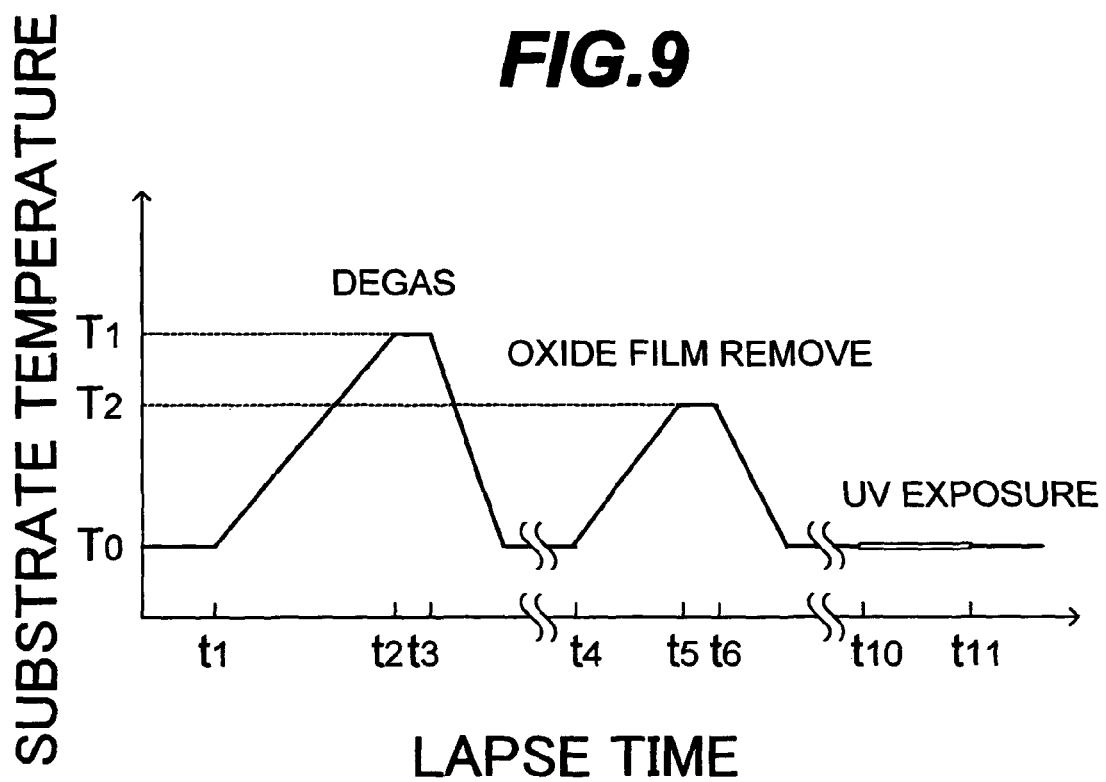
FIG. 9 is a graph showing a change in a substrate temperature during a manufacture method according to a third embodiment.

As shown in FIG. 9, after the oxide film removing process is completed, the substrate is transported into an ultraviolet irradiation chamber. The inside of the chamber is changed to a hydrogen gas atmosphere or a hydrogen carbide gas (e.g., methane gas) atmosphere. During a period from time $t_{10}$ to time $t_{11}$, ultraviolet rays of 220 nm or shorter in wavelength are irradiated to the interlayer insulating film. A light source of ultraviolet rays may be a halogen lamp or the like.

In order to retain sufficient tight adhesion of the barrier metal film 29 shown in FIG. 2C, the inner surfaces of the via hole 27 and wiring trench 28 are maintained hydrophilic. For example, if bonds of Si atoms on a surface are terminated by H or OH group, the surface becomes hydrophilic. In the third embodiment, ultraviolet rays are irradiated in an atmosphere of reducing gas such as hydrogen gas and hydrogen carbide gas to transform the surface into water-repellent property. The atmosphere of ultraviolet ray irradiation may be an inert gas atmosphere such as an Ar gas atmosphere. Transformation into the water-repellent property results from desorption of surface hydrogen atoms and hydroxyl group in the form of $H_2O$ from the substrate surface to be caused by ultraviolet ray irradiation. After the ultraviolet ray irradiation, Si—C bonds appear on the inner surfaces of the via hole 27 and wiring trench 28 and water-repellent property is presented.

Since the surface is water-repellent, it is possible to prevent re-attachment of moisture to the surface until the barrier metal film is formed. The water-repellent surface with Si—C bonds ensures that sufficient tight adhesion of the barrier metal film can be retained.

The present invention has been described in connection with the preferred embodiments. The invention is not limited only to the above embodiments. It will be apparent to those skilled in the art that other various modifications, improvements, combinations, and the like can be made.

What we claim are:

1. A method of manufacturing a semiconductor device comprising:
    (a) forming a recess through an insulating film formed over a semiconductor substrate using a resist pattern as a mask;
    (a1) after forming the recess, removing the resist pattern;
    (b) after removing the resist pattern, raising a temperature of the substrate to 300° C. or higher at a temperature rising rate of 10° C./s or slower to execute a first degassing process in a chamber, inside of which is evacuated to be a vacuum atmosphere;
    (b1) after the first degassing process, removing an oxide film formed over a bottom of the recess in reducing gas or in plasma of reducing gas;
    (e) after removing the oxide film, raising a temperature of the substrate at a temperature rising rate of 10° C./s or slower to execute a second degassing process in the chamber, inside of which is evacuated to be a vacuum atmosphere;
    (c) after the second degassing process, depositing a conductive film on the insulating film, the conductive film being embedded in the recess; and
    (d) polishing the deposited conductive film until the insulating film is exposed,
    wherein the step (e) executes the second degassing process at a temperature lower than a temperature for the first degassing process at the step (b).

2. The method of manufacturing a semiconductor device according to claim 1, further comprising between the steps (b1) and (c) a step of:
    (f) irradiating an ultraviolet ray to the insulating film in a reducing gas or an inert gas to transform a surface of the insulating film into water-repellent property.

3. The method of manufacturing a semiconductor device according to claim 2, wherein an atmosphere of the ultraviolet ray irradiation is a hydrogen gas atmosphere or a hydrogen carbide gas atmosphere.

4. The method of manufacturing a semiconductor device according to claim 3, wherein Si—C bonds appear on an inner surface of the recess by irradiating the ultraviolet ray.

5. The method of manufacturing a semiconductor device according to claim 2, wherein Si—C bonds appear on an inner surface of the recess by irradiating the ultraviolet ray.

6. The method of manufacturing a semiconductor device according to claim 1, wherein the step (b1) removes the oxide film by performing heat treatment in a reducing atmosphere.

7. The method of manufacturing a semiconductor device according to claim 1, wherein the step (b1) removes the oxide film by exposing the oxide film to plasma.

8. The method of manufacturing a semiconductor device according to claim 1, wherein a conductive member of copper or copper alloy is exposed on at least a partial bottom surface of the recess formed at the step (a).

9. The method of manufacturing a semiconductor device according to claim 1, wherein the second degassing process is executed at a temperature between 150° C. and 250° C.

* * * * *